(12) United States Patent
Gisin et al.

(10) Patent No.: US 7,457,132 B2
(45) Date of Patent: Nov. 25, 2008

(54) VIA STUB TERMINATION STRUCTURES AND METHODS FOR MAKING SAME

(75) Inventors: Franz Gisin, San Jose, CA (US); Christopher Herrick, Belmont, MA (US)

(73) Assignee: Sanmina-SCI Corporation, San Jose, CA (US)

( * ) Notice: Subject to any disclaimer, the term of this patent is extended or adjusted under 35 U.S.C. 154(b) by 23 days.

(21) Appl. No.: 11/255,523

(22) Filed: Oct. 20, 2005

(65) Prior Publication Data

US 2007/0091581 A1   Apr. 26, 2007

(51) Int. Cl.
H05K 7/00 (2006.01)

(52) U.S. Cl. .................. 361/782; 361/763; 361/766; 174/260; 174/261

(58) Field of Classification Search .................. 333/33; 257/499; 361/763, 766, 782; 174/260, 261
See application file for complete search history.

(56) References Cited

U.S. PATENT DOCUMENTS

| | | | |
|---|---|---|---|
| 5,079,069 A | 1/1992 | Howard et al. | |
| 5,155,655 A | 10/1992 | Howard et al. | |
| 5,161,086 A | 11/1992 | Howard et al. | |
| 5,162,977 A | 11/1992 | Paurus et al. | |
| 5,347,258 A | 9/1994 | Howard et al. | |
| 5,603,847 A | 2/1997 | Howard et al. | |
| 5,708,569 A | 1/1998 | Howard et al. | |
| 6,388,208 B1 * | 5/2002 | Kiani et al. | 174/266 |
| 6,593,535 B2 * | 7/2003 | Gailus | 174/262 |
| 6,927,471 B2 * | 8/2005 | Salmon | 257/499 |
| 7,030,712 B2 * | 4/2006 | Brunette et al. | 333/33 |
| 2002/0047090 A1 | 4/2002 | Sakurai et al. | |
| 2003/0116856 A1 | 6/2003 | Tomsio et al. | |
| 2006/0007662 A1 * | 1/2006 | Vasudivan et al. | 361/763 |
| 2006/0125573 A1 * | 6/2006 | Brunette et al. | 333/33 |

* cited by examiner

*Primary Examiner*—Dean A. Reichard
*Assistant Examiner*—Andargie M Aychillhum
(74) *Attorney, Agent, or Firm*—Perkins Coie LLP

(57) ABSTRACT

Vias are used in multilayer printed circuit boards to route electrical interconnects between layers. Some via constructions embodiments result in the formation of a via-stub section. Via stub sections can distort signals passing through the interconnect and decrease the usable bandwidth of the interconnect. To minimize distortion and increase bandwidth, one or more terminating elements can be attached to the unterminated end of the via-stub section. The impedance terminating element may include, by way of non-limiting example, one or more resistors, capacitors, and/or inductors between the via stub and a ground layer. The impedance terminating element may be formed internally to the PCB or mounted to the PCB surface.

29 Claims, 5 Drawing Sheets

VIA STUB TERMINATION STRUCTURES AND METHODS FOR MAKING SAME

BACKGROUND

Embodiments disclosed herein relate generally to printed circuit board (PCB) production and design, and more particularly to high-performance multi-layer PCB production and design.

Printed circuit boards, backplanes, midplanes, printed wiring boards, flex circuits, rigid flex-circuits, multi-chip-modules (MCM), and the like (herein referred to collectively as PCBs) have traditionally been used to provide an interconnect (a set of electrical circuit connections) for digital, analog and RF (radio frequency) signals that need to be routed between different locations within electronic devices including computers, networking systems and telecommunication equipment.

FIG. 1 is a cross-sectional view of a typical multilayer PCB 100 in accordance with the prior art. The PCB 100 includes multiple signal traces and/or planar conductive layers 110a-f separated by rigid or flexible planar insulating dielectric layers 115a-e bonded together. When routing an interconnect through a PCB, it often becomes necessary to move the interconnect between planar layers 110a-f. An electrical connection path used to accomplish this function is a via. Thru-hole vias 120 pass completely through the body of PCB 100, blind vias 125 only have one end of the via extend to the surface of the PCB 100, and buried vias 130 have neither end extend to the surface of the PCB 100.

Small conductive regions called pads may be directly attached to the via on one or more of the conductive layers. Pads that are a functional part of the interconnect are called functional pads 135a-f. Pads that are not needed in order to complete the interconnect as it is routed between layers are called non-functional pads 140. Pads may be electrically isolated from the rest of the layer by an non-conductive anti-pad region 145.

In FIG. 1, signal traces 150a and 150b on layers 110a and 110c respectively are electrically connected together through via 120 and functional pads 135a and 135b. Alternate interconnect connection schemes including press-fit connector pins 160 and discrete/planar passive components and circuits attached directly to a via pad can also be used in lieu of the signal trace 150a.

The series portion of the via that is necessary in order to provide an electrical connection between the desired layers is called the via-thru section 155a-c. The via may also include a non-functional portion called a via-stub section 165a165b165c that extends beyond the functional pads 135b 135d 135f. The end of the via-stub section that is not connected to the functional part of the interconnect 170a-c is the unterminated end of the via-stub section.

The presence of one or more via-stub sections in an interconnect can significantly reduce its useable bandwidth and detrimentally distort signals that propagate through the interconnect. One technique that has been used to mitigate the interconnect bandwidth and signal distortion limitations in the prior art includes back-drilling as shown in detail 180 of FIG. 1. A drill whose diameter 185 is wider than the finished hole-size is used to remove a substantial portion 190a of the via-stub section, leaving a short residual stub 190b that no longer has a significant impact on the interconnect's performance.

However, back-drilling is time consuming, expensive, and errors may irreparably damage the PCB 100. Further, back-drilling cannot be applied to via structures whose via-stub sections 165b-c do not extend all the way to the surface of the PCB unless provisions are taken to keep essential interconnects from being routed through the PCB regions 195a-b that will be removed during the backdrilling operation.

SUMMARY

An embodiment, by way of non-limiting example, includes a multi-layer board structure comprising a number of conductive layers separated by a number of non-conductive layers, the multi-layer board structure being provided with at least one via extending from at least a first conductive layer beyond a second conductive layer. An electrically conductive material disposed within the via to electrically interconnect the at least two conductive layers, the electrically conductive material having an stub portion which extends beyond the second conductive layer. A terminating element electrically connected to the stub portion.

Another embodiment, by way of non-limiting example, includes forming a via in a multi-layer printed circuit board structure comprising a number of conductive layers separated by a number of non-conductive layers; providing an electrically conductive material within the via to electrically connect at least two conductive layers of the conductive layers; and providing a terminating element to electrically terminate a stub section of the electrically conductive material.

Another embodiment, by way of non-limiting example, includes a number of conductive layers; a number of conductive vias configured to route signals between the conductive layers; and a number of terminating elements electrically connected to via-stub elements of the number of conductive vias.

Another embodiment, by way of non-limiting example, includes a first conductive trace configured as a first portion of a circuit for carrying an electrical signal from a source to a destination coupled to the printed circuit board, the first conductive trace on a first layer of the printed circuit board; a second conductive trace configured as a second portion of the circuit, the second conductive trace on a second layer of the printed circuit board; a via including an electrically conductive material configured to couple the first conductive trace and the second conductive trace; and a terminating element configured to couple energy diverted from the circuit by the via to a ground layer of the printed circuit board.

An advantage of certain embodiments is that it increases the useable bandwidth of an interconnect without resorting to expensive backdrilling. Another advantages is that the terminating elements can be used with all types of vias, including through hole vias, blind vias and buried vias.

Terminating elements can be arranged to decrease distortion and increase useable bandwidth of a variety of PCB based transmission line interconnect configurations containing via-stub sections including single ended microstrips, single-ended striplines, edge-coupled differential-pair microstrips, edge-coupled differential-pair striplines, broadside-coupled differential-pair microstrips, broadside-coupled differential pair striplines, and slot-lines.

Terminating elements can be comprised of: one or more discrete components such as resistors, capacitors and inductors mounted on the surface of the PCB; one or more planar resistive, capacitive and inductive elements incorporated directly into the PCB during the manufacturing process; or a combination of discrete components and planar passive elements. Planar elements incorporated into the PCB manufacturing process can be constructed from a variety of materials including polymer thick film materials, thin film materials, metallic alloys, and organic materials.

In exemplary embodiments, terminating elements can comprise circuits. In other exemplary embodiments, terminating elements can be active components. These and other embodiments and advantages will become apparent to those skilled in the art upon a reading of the following descriptions and a study of the drawings.

DETAILED DESCRIPTION OF THE PREFERRED EMBODIMENTS

The embodiments discussed herein are illustrative of some examples of structures and methods. As these embodiments are described with reference to illustrations, various modifications or adaptations of the methods and/or specific structures described will become apparent to those skilled in the art. All such modifications, adaptations, or variations that rely upon the teachings of the exemplary embodiments, and through which these teachings have advanced the art, are considered to be within the scope of the present invention. Hence, these descriptions and drawings should not be considered in a limiting sense, as it is understood that the present invention is in no way limited to only the exemplary embodiments and combinations illustrated herein.

Figure 1:
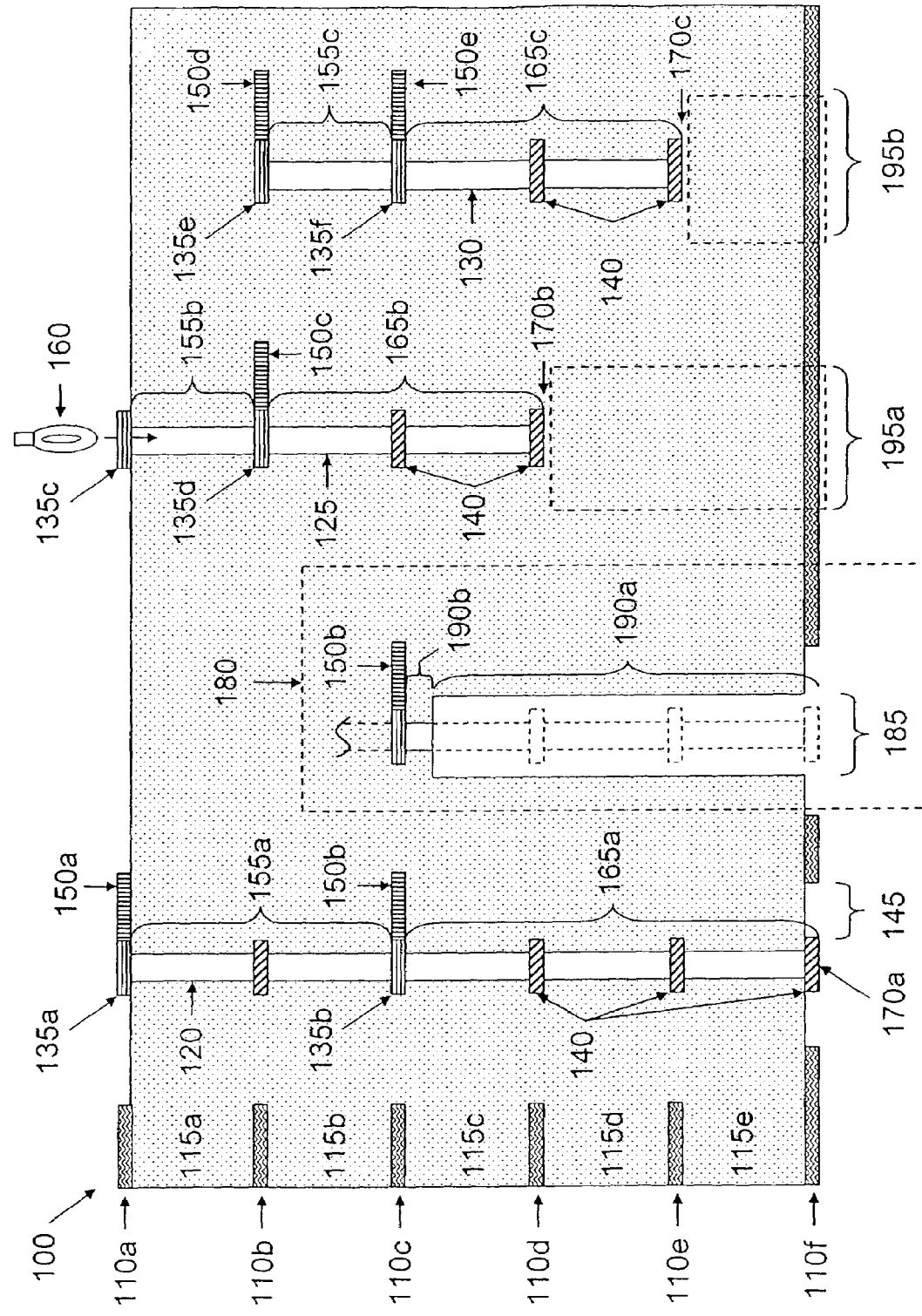
FIG. 1 is a cross section of a printed circuit board showing an exemplary prior art multi-layer printed circuit board including vias.
Figure 2:
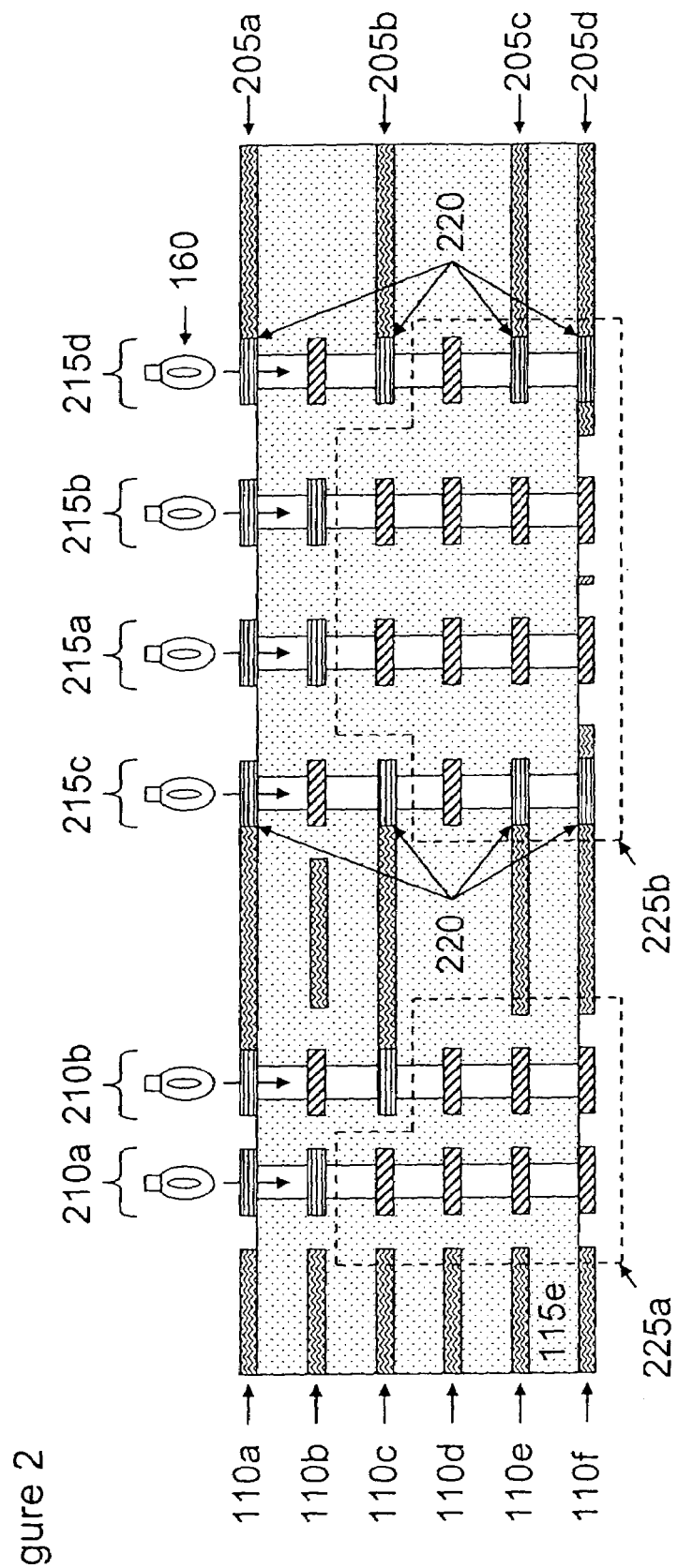
FIG. 2 is a cross section of a printed circuit board graphically showing how a plurality of individual via-stub sections are combined into a circuit-stub section.

A typical PCB interconnect is comprised of more than one series conductive path. When routing an interconnect between PCB layers, a separate via must be used for each series conductive path. FIG. 2 shows several embodiments. FIG. 2 shows a cross section of a portion of a PCB located directly underneath a press-fit connector (only the pins 160 of the connector are shown for clarity). Interconnects designed to be routed as a single-ended microstrip or stripline transmission lines inside the PCB generally require a minimum of two vias, one for the signal path 210a and one for the signal return path 210b. Interconnects configured as differential-pair microstrip or stripline transmission lines normally require at least three vias, two for the two differential signal paths 215a-b and one for the common mode return path, either 215c or 215d. Often both vias 215c-d are used for the common mode return path of a differential pair in order to preserve electrical symmetry between the common mode and differential modes of the differential pair interconnect. It is also common practice to directly connect vias associated with return signals, for example 215c-d, to all layers 220 that contain ground planes 205a-d.

The collection of via-stub sections associated with the plurality of vias used to route an interconnect between PCB layers forms a circuit-stub. Circuit-stub 225a is associated with the routing of an isolated (signal return not connected to all PCB layers containing ground planes) single ended interconnect 210a-b configured as a stripline transmission line using layers 100a-110c. Circuit-stub 225b is associated with the routing of an edge-coupled differential pair 215a-d using layers 110a-c when the common mode return paths 215c-d are connected to all PCB layers 220 containing ground planes 205a-d. For the embodiments shown in FIG. 2, the unterminated end of the circuit-stub sections occurs on layer 110f.

Figure 3:
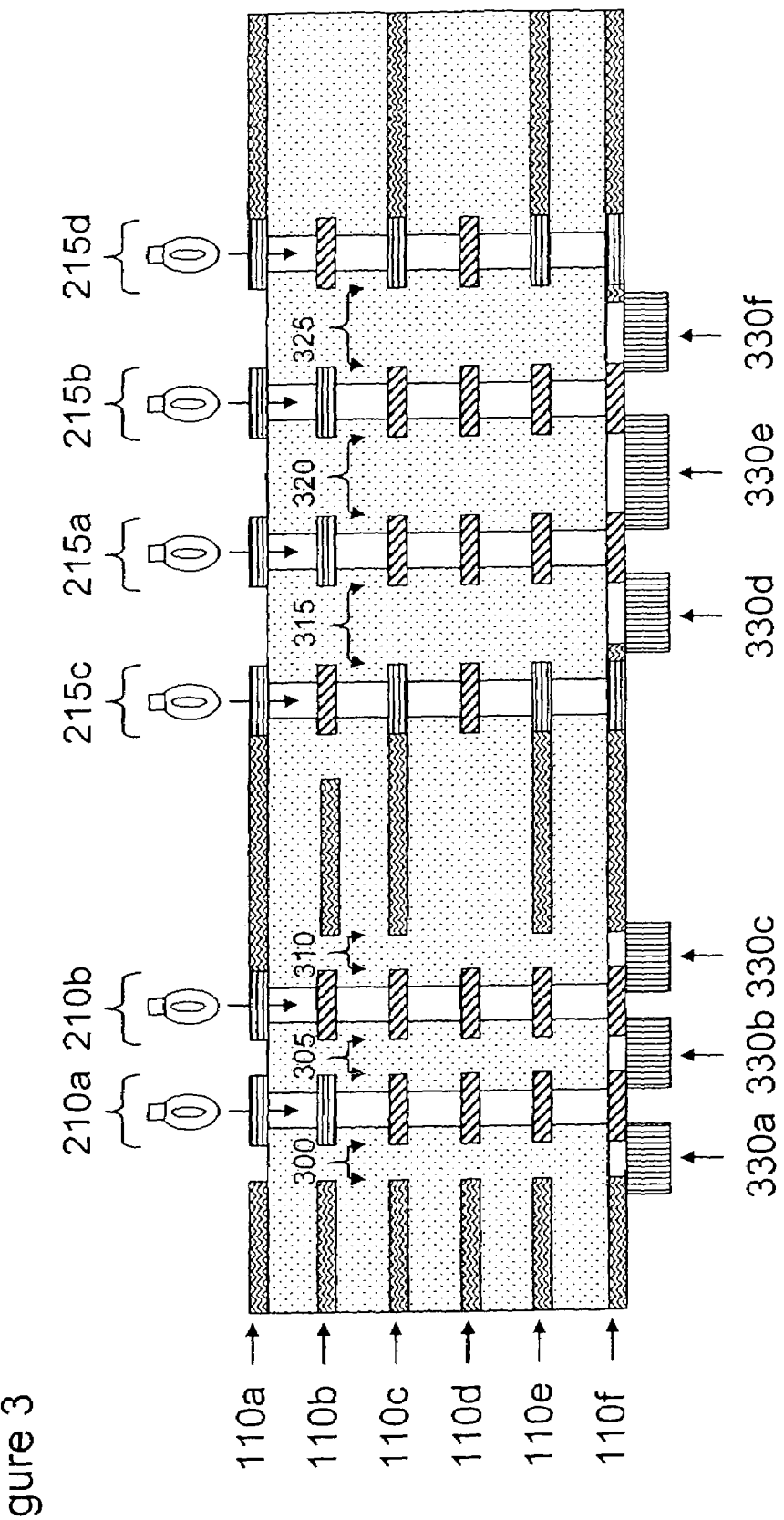
FIG. 3 is a cross section of a printed circuit board showing several embodiments of via-stub sections terminated with discrete components.

FIG. 3 shows how the circuit-stubs of 225a-b of FIG. 2 can be terminated using discrete components mounted on the side where the unterminated end of the circuit-stub is located. For the embodiments shown, this is the PCB side which contains layer 110f. Depending on the impedance looking into different portions of the circuit-stub 300, 305, 310, 315, 320, and 325, discrete terminating elements 330a-f are connected as required. For complex circuit-stubs consisting of a plurality of individual via stubs, an electromagnetic simulation program may have to be used to quantify the impedances looking into the different portions of the circuit-stub 300, 305, 310, 315, 320, and 325. For most commonly used interconnect geometries, a significant reduction in signal distortion and increase in useable bandwidth only require discrete resistors in locations 330b and 330e. If additional performance improvements are required, then terminating elements in all locations 330a-f may be required. Additional performance improvements can also be obtained by substituting substantially resistive elements with a more complex circuit comprising of one or more discrete resistors, capacitors and inductors. Commonly used PCB component mounting and connection techniques including direct attachment to a via-stub section pad (shown) and the use of short traces to connect the components to the via-stub section pads (not shown) may be employed.

Figure 4:
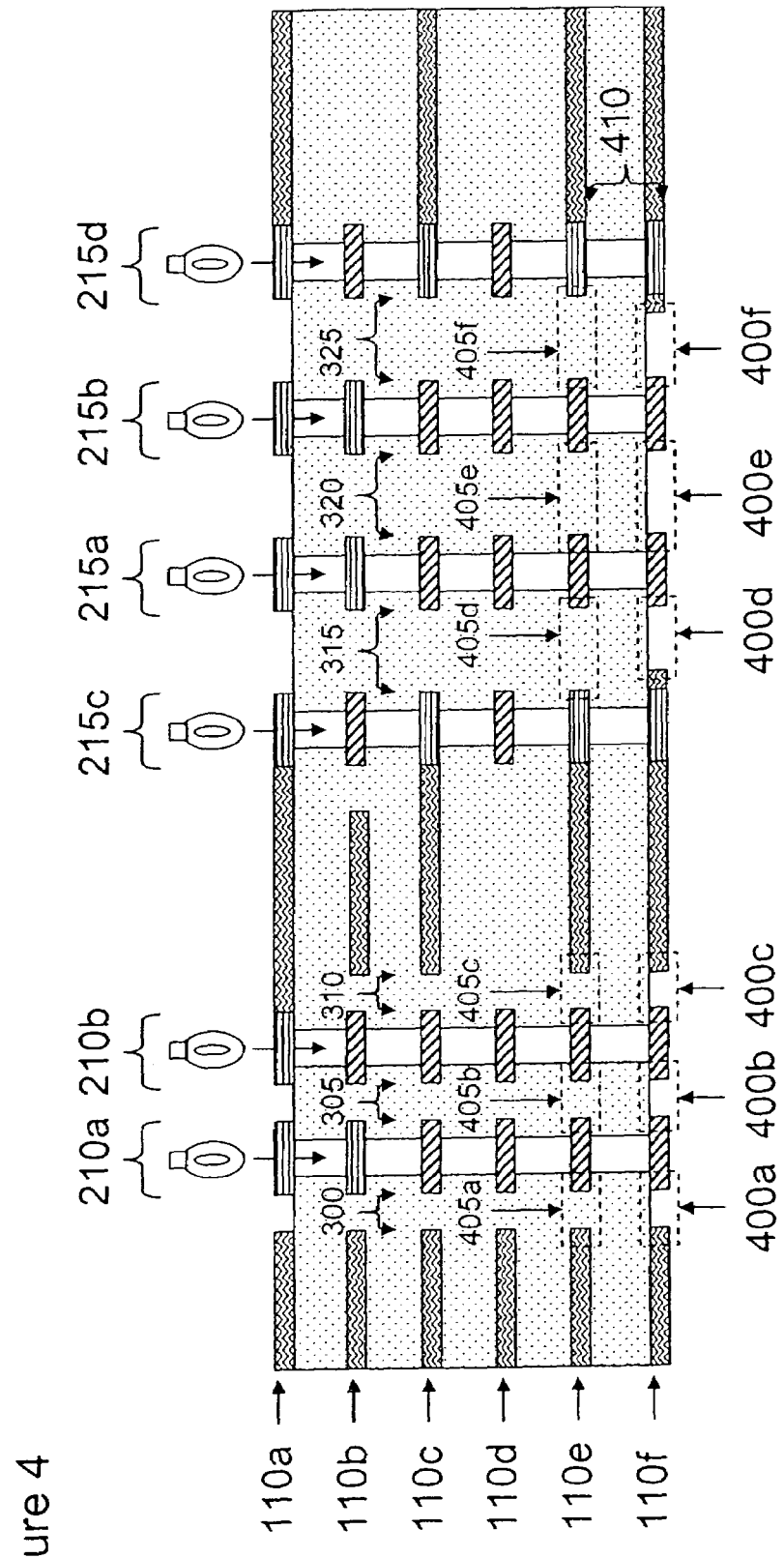
FIG. 4 is a cross section of a printed circuit board showing several embodiments of via-stub sections terminated with co-planar elements located on a conductive layer in a printed circuit board.

FIG. 4 shows the preferred circuit-stub embodiment using planar passive terminations that are built into the PCB during manufacturing. The same general principles outlined for the discrete embodiment described in the previous paragraph also apply with discrete terminating elements 330a-f being replaced by planar passive terminating elements located at 400a-f on layer 110f.

The planar terminating elements do not have to be at the end of the unterminated circuit-stub end as long as the residual circuit-stub 410 is short enough so its impact on the interconnect's performance is minimal. For example, noticeable improvement in interconnect performance can still be attained if the terminating elements 405a-f are located on layer 110e.

Figure 5:
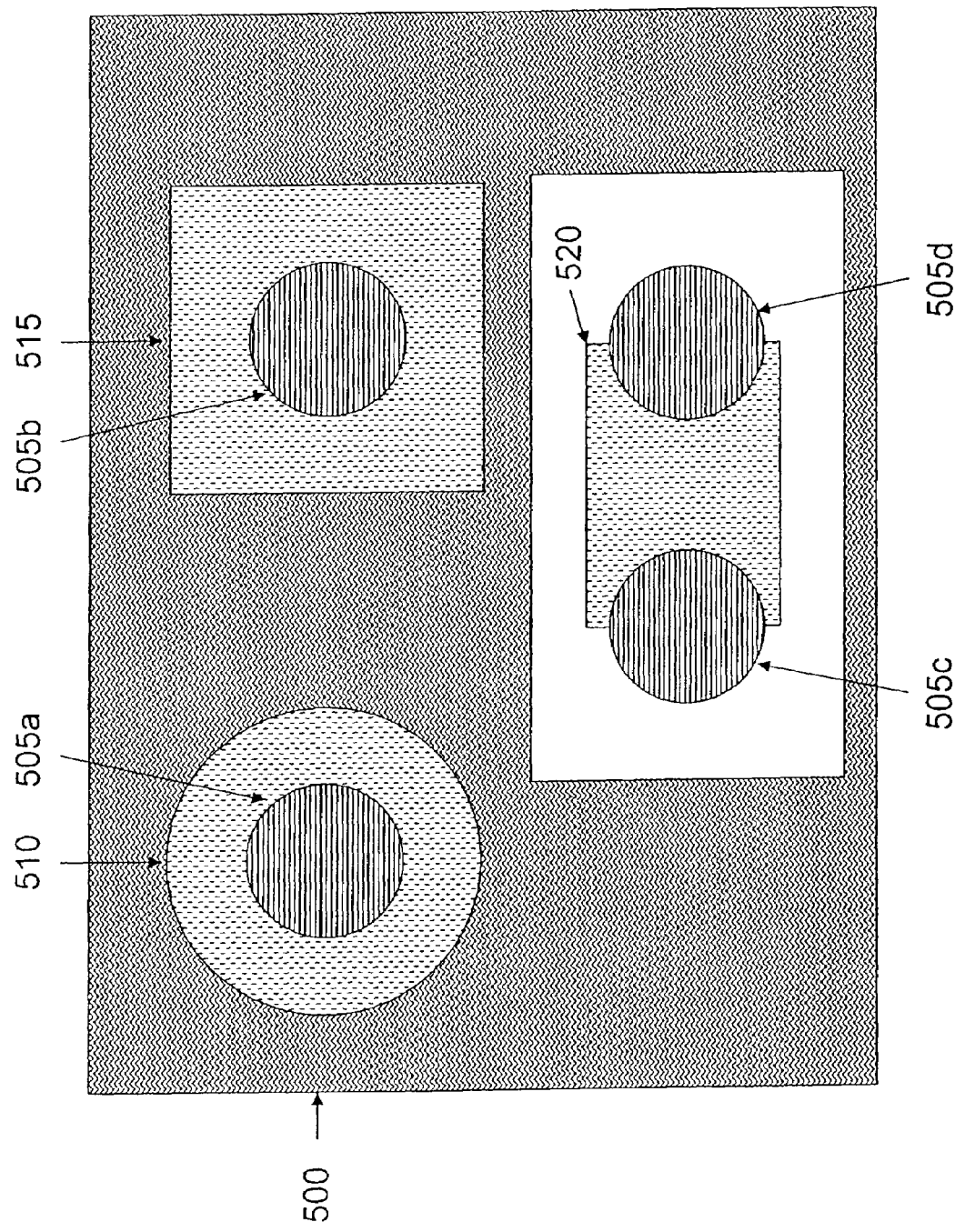
FIG. 5 is a plan view showing via stub termination scheme for reducing signal distortions.

FIG. 5 illustrates a magnified top view of a portion of a ground layer (for example, layers 110e and 110f) incorporating one of the impedance terminating elements 400a-f and 405a-f of FIG. 4 as an annular resistor 510, in one embodiment in accordance with the present invention. The annular resistor 510 is described in detail in U.S. Pat. Nos. 5,447,258, 5,604,847, and 5,108,569, assigned to Hadco Santa Clara, Inc., a wholly owned subsidiary of Sanmina-SCI Corporation; the disclosures of which patents are incorporated herein. The via 505a is at least partially surrounded by and coupled to an inner circumference of the annular resistor 510. At least a portion of the outer circumference of the annular resistor 510 is coupled to the ground layer 500. In some embodiments, the annular resistor 510 comprises a resistive material such as a polymer thick film material, a resistive thin film metal, a resistive metallic alloy, and/or a resistive organic material to form a resistor electrically coupled to both the ground layer 500 and the via 505a.

FIG. 5 also illustrates a terminating element 400a-f and 405a-f configured as a rectangular resistor 515, in an alternative embodiment in accordance with the present invention.

The rectangular resistor 515 is an alternative embodiment of the annular resistor 510, as disclosed in the aforementioned patents incorporated by reference. The via 505b is at least partially surrounded by and coupled to an inner circumference of the rectangular resistor 520. At least a portion of the outer periphery of the rectangular resistor 515 is coupled to the ground layer 500. The rectangular resistor 515 comprises a resistive material such as a polymer thick film material, a resistive thin film metal, a resistive metallic alloy, and/or a resistive organic material to form a resistor electrically coupled to both the ground layer 500 and the via 505b.

As will be appreciated by those skilled in the art, terminating elements can be provided in various shapes to add in the manufacturing process and to tune their operating characteristics. By way of non-limiting example, a passive element can be a conic section such as a circle or an ellipse. By way of further non-limiting example, a passive element can be a polygon such as a square, rectangle, or octagon.

In another embodiment the terminating element may comprise an area of resistive material 520 connecting two via pads together. Such a configuration would be used, for example for elements 400b 400e 405b and 405e in FIG. 4. The planar passive elements 510, 515 and 520 may be combined into one structure to create, for example, the terminating structures 400a-c, 400d-f, 405a-c and 400d-f.

Those skilled in the art will understand that there are numerous other shapes for the impedance terminating elements 510, 515 and 520. For example, the terminating element may be oval or rounded rectangular. The rounded rectangular shape may improve processing of the layer such as etching of the layer 500 and deposition of the terminating element 510, 515, or 520 in the etched portion of the layer 500.

While the exemplary embodiments described above include a single component as the terminating element, as used herein the "terminating element" also includes terminating circuitry. For example, a terminating element may include an RC circuit, an LC circuit, and RL circuit, an RLC circuit, etc. Furthermore, while the exemplary embodiments described above have passive components such as resistors, capacitors and inductors used in as the terminating element, other embodiments may include active components such as diodes or transistors.

Although a preferred embodiment of the invention has been described using specific terms and devices, such description is for illustrative purposes only. The words used are words of description rather than of limitation. It is to be understood that changes and variations may be made by those of ordinary skill in the art without departing from the spirit or the scope of the present invention, which is set forth in the following claims. In addition, it should be understood that aspects of various other embodiments may be interchanged both in whole or in part. Therefore, the spirit and scope of the appended claims should not be limited to the description of the preferred version contained herein.

What is claimed is:

1. A printed circuit board, comprising:
 a multi-layer board structure comprising a plurality of conductive layers separated by a plurality of non-conductive layers;
 a plurality of vias electrically coupling a first conductive layer of the plurality of conductive layers and a second conductive layer of the plurality of conductive layers;
 wherein at least one via of the plurality of vias comprises a via-through section and a via-stub section, the via-through section extending between the first and second conductive layers to provide functional electrical coupling between the first and second conductive layers, the via-stub section extending beyond the second conductive layer;
 a circuit-stub comprising a set of via-stub sections of the at least one via, the circuit-stub having an un-terminated end;
 electrically conductive material disposed within said plurality of vias to electrically couple the first conductive layer and the second conductive layer;
 one or more discrete terminating elements coupled to the un-terminated end of the circuit-stub, wherein termination of the circuit-stub using the one or more discrete terminating elements increases useable bandwidth of the multi-layer board structure.

2. A printed circuit board as recited in claim 1, wherein one or more of the discrete terminating elements comprise a circuit.

3. A printed circuit board as recited in claim 1, wherein at least one of the discrete terminating elements includes a resistive element.

4. A printed circuit board as recited in claim 1, wherein at least one of the discrete terminating elements includes a passive element, and wherein the passive element includes an element selected from the group consisting of a resistor, a capacitor, and an inductor mounted to the multilayer structure.

5. A printed circuit board as recited in claim 1, wherein at least one of the discrete terminating elements is formed substantially coplanar with a conductive layer.

6. A printed circuit board as recited in claim 1, wherein at least one of the discrete terminating elements comprises a combination of one or more discrete components and one or more coplanar elements.

7. A printed circuit board as recited in claim 1, wherein at least one of the discrete terminating elements includes a passive element, and wherein the passive element comprises one or more annular resistors.

8. A printed circuit board as received in claim 7, wherein said one or more annular resistors are selected from shapes including conic sections and polygons.

9. A printed circuit board as recited in claim 1, wherein at least one of the discrete terminating elements includes a passive element, and wherein the passive element comprises one or more elements selected from the group consisting of a polymer thick film material, a thin film metal, a metallic alloy, and a resistive organic material.

10. A printed circuit board of claim 9, wherein the elements can be selectively or planarly distributed with the PCB.

11. A method comprising:
 forming a plurality of vias in a multi-layer printed circuit board structure comprising a plurality of conductive layers separated by a plurality of non-conductive layers;
 wherein at least one via of the plurality of vias comprises a via-through section and a via-stub section, the via-through section extending between at least two conductive layers of the plurality of conductive layers to provide functional electrical coupling between the at least two conductive layers, the via-stub section extending beyond one of the at least two conductive layers;
 wherein, a circuit-stub comprises a set of via-stub sections of the at least one via, the circuit-stub having an un-terminated end;
 providing electrically conductive material within said vias to electrically connect at least two conductive layers of said conductive layers;
 terminating the un-terminated end of the circuit-stub with at least one discrete terminating element.

12. A method as recited in claim 11, wherein the terminating element includes a passive element.

13. A method as recited in claim 12, wherein the passive element includes at least one of a resistor, a capacitor, and an inductor.

14. A printed circuit board, comprising:

a plurality of conductive layers;

a plurality of conductive vias configured to route signals between the plurality of conductive layers;

wherein at least one via of the plurality of conductive vias comprises a via-through section and a via-stub section, the via-through section extending between at least two of the plurality of conductive layers to provide functional electrical coupling between the at least two conductive layers, the via-stub section extending beyond one of the at least two conductive layers;

a circuit-stub comprising a set of via-stub sections of the at least one via, the circuit-stub having an un-terminated end;

a plurality of terminating elements electrically connected to the un-terminated end of the circuit-stub.

15. A printed circuit board as recited in claim 14, wherein the plurality of terminating elements comprises at least one of a resistor, a capacitor, and an inductor.

16. A printed circuit board as recited in claim 14, wherein the at least one via of the plurality of vias is selected from the group consisting of a through via, a buried via, and a blind via.

17. A printed circuit board as recited in claim 14, wherein said plurality of terminating elements comprises a circuit.

18. The printed circuit board of claim 14, wherein the plurality of terminating elements comprises at least one planar element.

19. The printed circuit board of claim 14, wherein the at least one planar element is passive.

20. The printed circuit board of claim 14, wherein the plurality of terminating elements comprises at least one active component.

21. The printed circuit board of claim 18, wherein the plurality of terminating elements comprises a combination of discrete elements and planar elements.

22. The printed circuit board of claim 14, wherein the usable frequency is increased.

23. A printed circuit board, comprising:

a first conductive trace configured as a first portion of a circuit for carrying an electrical signal from a source to a destination coupled to the printed circuit board, the first conductive trace on a first layer of the printed circuit board;

a second conductive trace configured as a second portion of the circuit, the second conductive trace on a second layer of the printed circuit board;

a via including an electrically conductive material configured to couple the first conductive trace and the second conductive trace;

wherein the via comprises a via-through section and a via-stub section, the via-through section extending between the first and second conductive traces, the via-stub section extending beyond the second conductive layer, the via-stub section having an un-terminated end distal from the second conductive layer;

a discrete terminating element coupled to the un-terminated end of the via-stub section of the via to couple energy diverted from the circuit by the via to a ground layer of the printed circuit board, wherein the discrete resistive terminating elements are associated with a reduction in signal distortion.

24. A printed circuit board as recited in claim 23, wherein the discrete terminating element includes a passive terminating element.

25. A printed circuit board as recited in claim 23, wherein the discrete terminating element comprises a circuit.

26. A printed circuit board as recited in claim 23, wherein the discrete terminating element comprises a component mounted on a surface of the printed circuit board.

27. A printed circuit board as recited in claim 23, wherein the discrete terminating element comprises a passive element substantially coplanar with a conductive layer.

28. The printed circuit board of claim 23, wherein the discrete terminating element is selected from a group consisting of an annular resistor and a rectangular resistor.

29. The printed circuit board of claim 23, wherein the discrete terminating element comprises resistive material selected from a group comprising of a polymer thick film material, a resistive thin film metal, a resistive metallic alloy, and a resistive organic material.

* * * * *